United States Patent
Chen et al.

(10) Patent No.: US 7,701,687 B2
(45) Date of Patent: Apr. 20, 2010

(54) SURGE PROTECTION CIRCUIT

(75) Inventors: Kuang-Che Chen, Taipei (TW);
Her-Jun Chueh, Taipei (TW)

(73) Assignee: Primax Electronics Ltd., Taipei (TW)

( * ) Notice: Subject to any disclaimer, the term of this patent is extended or adjusted under 35 U.S.C. 154(b) by 363 days.

(21) Appl. No.: 11/372,801

(22) Filed: Mar. 10, 2006

(65) Prior Publication Data
US 2007/0159759 A1    Jul. 12, 2007

(30) Foreign Application Priority Data
Jan. 10, 2006    (TW) ............................. 95100876 A

(51) Int. Cl.
*H02H 5/04* (2006.01)

(52) U.S. Cl. ..................................... 361/104

(58) Field of Classification Search ............... 361/127, 361/104
See application file for complete search history.

(56) References Cited

U.S. PATENT DOCUMENTS

| 5,148,345 | A * | 9/1992 | Allina | 361/104 |
| 5,241,445 | A * | 8/1993 | Karasawa | 361/104 |
| 5,404,126 | A * | 4/1995 | Kasai et al. | 338/21 |
| 5,502,612 | A * | 3/1996 | Osterhout et al. | 361/117 |
| 2006/0230606 | A1 * | 10/2006 | Dowil | 29/623 |
| 2007/0217111 | A1 * | 9/2007 | Tseng | 361/118 |

* cited by examiner

*Primary Examiner*—Ronald W Leja
(74) *Attorney, Agent, or Firm*—Apex Juris, pllc; Tracy M Heims

(57) ABSTRACT

A surge protection circuit includes a first surge absorber and a first conducting wire. The first surge absorber has an end electrically connected to a first power signal line. The first conducting wire is covered with insulating material and electrically connected to the other end of the first surge absorber and a second power signal line. The first surge absorber absorbs energy of a surge signal in a short-circuit state when the surge signal flows through the first power signal line or the second power signal line. Afterwards, the first conducting wire which is connected to the first surge absorber in series is damaged by the energy of the surge signal to enter an interrupted state, thereby protecting a signal processing device which is electrically connected to the first power signal line and the second power signal line.

20 Claims, 4 Drawing Sheets

SURGE PROTECTION CIRCUIT

FIELD OF THE INVENTION

The present invention relates to a surge protection circuit, and more particularly to a surge protection circuit for use with an electrical socket.

BACKGROUND OF THE INVENTION

Generally, signal processing devices are susceptible to transient surge signals transmitted from the transmission lines. In designing electrical sockets, it is very important to prevent the transient surge signals from transmitting to the signal processing devices via the electrical sockets because the signal processing devices are readily damaged by the transient surge signals. Furthermore, according to many safety regulations, surge tests should be performed before the electrical sockets come into the market.

Hereinafter, a schematic circuit diagram of a conventional electrical socket is illustrated with reference to FIG. 1.

In FIG. 1, the electrical socket 10 comprises a surge protection circuit 11 and a power supply circuit 12. The power supply circuit 12 of the electrical socket 10 has a socket structure (not shown) to be electrically connected with a signal processing device 13 such as any kind of electrical appliance or electronic device. Via the electrical socket 10, the electrical signals from the signal lines L, N and G are transmitted to the signal processing device 13. The operation principles of the power supply circuit 12 and the signal processing device 13 are well known in the art, and are not intended to redundantly describe herein. The principle of operating the surge protection circuit 11 will be illustrated as follows.

In order to prevent damage of the signal processing device 13 due to surge signals, surge absorbers are interconnected between any two signal lines of these three signal lines L, N and G. As shown in FIG. 1, the surge protection circuit 11 includes a Line-to-Neutral surge absorber 111, a Neutral-to-Ground surge absorber 112 and a Line-to-Ground surge absorber 113. Each of the surge absorbers 111, 112 and 113 is implemented by one, two or three metal oxide varistors (MOVs). Since the surge energy adsorbed by the metal oxide varistors is typically converted into heat, thermal fuses 114 and 115 are electrically connected to the input terminals of the signal lines L and G in series. In accordance with a protective measure, the electrical signal loop is instantly interrupted when the temperature surrounding the thermal fuse 114 and/or 115 reaches a predetermined value. In practical, for facilitating detecting the ambient temperature, the thermal fuse 114 is arranged in the vicinity of the surge absorber 111, and the thermal fuse 115 is arranged in the vicinities of the surge absorbers 112 and 113.

In an alternative approach, a break-switch 116 is connected to the input terminal of the fire line L. In a case that the current flowing through the fire line L is greater than a specific current rating (e.g. 50 amperes), the latch of the break-switch 116 is released for permitting interruption of the overcurrent. Since the process of releasing the latch is instantaneous, the resulting transient surge signals are difficult to be coped with. Therefore, the surge absorbers 111, 112 and 113 are indispensable for protecting the signal processing device 13.

Since the safety regulations become more severe, the surge protection circuit 11 fails to pass these safety regulations and deal with the surge problems. The reasons of causing these problems are illustrated as follows.

First of all, the surge protection circuit 11 and the power supply circuit 12 are mounted on a circuitry substrate 101 (as shown in FIG. 2). In addition, several metallic traces are formed on the surface of the circuitry substrate 101. According to the earlier UL (Underwriters Laboratories Inc.) safety regulations, the electrical connection between the metallic traces of the power signal lines and the surge absorber 111, 112 or 113 is interrupted if a overcurrent greater than 1,000 amperes is absorbed by either of the surge absorbers 111, 112 and 113. For example, as shown in FIG. 1, the trace t11 between the surge absorber 111 and the node N11 and the trace t12 between the node N12 and the thermal fuse 115 should be operated in the interrupted states if the tested overcurrents flow therethrough. Under this circumstance, the surge absorber in a short-circuit state when the overcurrent flows therethrough would no longer form a leakage current path to communicate with the signal processing device 13.

Unfortunately, at that moment when the overcurrents flow the traces t11 and t12, the traces t11 and t12 are readily subject to carbonization, which is unexpected or controlled. As a consequence, other electronic components or traces surrounding the traces t11 and t12 and on the circuitry substrate 101 are adversely affected to form another leakage current path.

Moreover, according to the safety regulations of UL 1449, second version, the equipment should be additionally capable of withstanding high current of 50~150 amperes. As known, since the line widths of the traces t11 and t12 fail to be precisely controlled, the line widths are usually too narrow or broad. In a case that the line widths are too narrow, the surge absorbers 111, 112 and 113 are operated in the interrupted states before entering the breakage region to eliminate and absorb the surge energy. Under this circumstance, the surge signals are possibly fled to the signal processing device 13, and thus the signal processing device 13 is damaged. In a case that the line widths are too broad, the time period for allowing the current to flow through the surge absorbers 111, 112 and 113 is extended. In addition, these surge absorbers become very hot to cause ignition.

As a consequence, the surge protection circuit 11 fails to meet the requirements of the safety regulations of UL 1449, second version. Since the new standard for Safety for Transient Voltage Surge Suppression (TVSS) is more severe than that of UL 1449 (second version), the surge protection circuit 11 fails to withstand transient voltage surge 6 KV/3 KA.

In order to avoid generation of leakage current path due to carbonization of the traces t11 and t12, an isolating casing is employed. Please refer to FIG. 2, which is a layout structure illustrating a surge absorber and an isolating casing of a conventional electrical socket. Such layout structure is disclosed in Taiwanese Patent No. M273813, and the contents of which are hereby incorporated by reference. As shown in FIGS. 1 and 2, the surge absorber 111 and the thermal fuse 114 are mounted onto the circuitry substrate 101, and then covered with an isolating casing 117. Therefore, on account of convenience and normal operation of the surge absorber, broader line widths of the traces interconnected between the surge absorber 111 and the power signal lines of the circuitry substrate 101 are rendered. On the other hand, if the surge absorber 111 is suffered from ignition due to overheating, the surge absorber 111 is isolated from the surroundings by the isolating casing 117.

The layout structure of FIG. 2, however, increases the fabricating cost. In addition, since the line widths are widened, the time period for allowing the current to flow through the surge absorber 111 is extended, and thus the traces fail to be interrupted in a designated time interval. In other words, the layout structure of FIG. 2 is unable to withstand the high current test of 50~150 amperes according to the safety regulations of UL 1449, second version and unable to withstand transient voltage surge of 6 KV/3 KA according to the standard for Safety for Transient Voltage Surge Suppression (TVSS).

For solving these problems, another electrical socket 30 is illustrated. The electrical socket 30 comprises a surge protection circuit 31 and a power supply circuit 32. The power supply circuit 32 of the electrical socket 30 has a socket structure (not shown) to be electrically connected with a signal processing device 33. Via the electrical socket 30, the electrical signals from the signal lines L, N and G are transmitted to the signal processing device 33. Most components included in the surge protection circuit 31 are similar to that shown in FIG. 1, and are not intended to redundantly describe herein. The surge protection circuit 31 is distinguished by the trace t31 between the surge absorber 311 and the node N31 and the trace t31 between the node N32 and the thermal fuse 315. Each of the traces t31 and t32 is coated with an isolating lacquer I, the problems resulted from carbonization are solved. This electrical socket, however, fails to pass the new standard for Safety for Transient Voltage Surge Suppression because the surge absorbers 311, 312 and 313 are still suffered from ignition due to overheating.

In views of the above-described disadvantages resulted from the prior art, the applicant keeps on carving unflaggingly to develop a surge protection circuit according to the present invention through wholehearted experience and research.

SUMMARY OF THE INVENTION

It is an object of the present invention to provide a surge protection circuit for avoiding leakage current resulted from carbonization of traces.

Another object of the present invention provides a surge protection circuit capable of withstanding high current of 50~150 amperes or overcurrent greater than 1,000 amperes and withstanding transient voltage surge of 6 KV/500 A or 6 KV/3 KA according to the related safety regulations.

In accordance with a first aspect of the present invention, there is provided a surge protection circuit. The surge protection circuit comprises a first surge absorber and a first conducting wire. The first surge absorber has an end electrically connected to a first power signal line. The first conducting wire is covered with insulating material and electrically connected to the other end of the first surge absorber and a second power signal line. The first surge absorber absorbs energy of a surge signal in a short-circuit state when the surge signal flows through the first power signal line or the second power signal line. Afterwards, the first conducting wire which is connected to the first surge absorber in series is damaged by the energy of the surge signal to enter an interrupted state, thereby protecting a signal processing device which is electrically connected to the first power signal line and the second power signal line.

In an embodiment, the surge protection circuit further comprises a second surge absorber. The second surge absorber has an end electrically connected to the first power signal line and the other end electrically connected to a second conducting wire which is electrically connected to a third power signal line and covered with insulating material, thereby protecting the signal processing device which is electrically connected to the first power signal line and the third power signal line.

In an embodiment, the surge protection circuit further comprises a third surge absorber. The third surge absorber has an end electrically connected to the second power signal line and the other end electrically connected to the second conducting wire which is electrically connected to a third power signal line and covered with insulating material, thereby protecting the signal processing device which is electrically connected to the second power signal line and the third power signal line.

In an embodiment, the surge protection circuit further comprises a first thermal fuse. The first thermal fuse has an end electrically connected to the second power signal and the other end electrically connected to the third surge absorber and the first conducting wire, such that the first thermal fuse is arranged between the second power signal and the third surge absorber/the first conducting wire and in the vicinity of the first surge absorber.

In an embodiment, the surge protection circuit further comprises a second thermal fuse. The second thermal fuse has an end electrically connected to the second conducting wire and the other end electrically connected to the second surge absorber and the third surge absorber, such that the second thermal fuse is arranged between the second conducting wire and the second surge absorber/the third surge absorber and in the vicinity of the second surge absorber and the third surge absorber.

Preferably, each of the first, second and third surge absorbers is a metal oxide varistor (MOV). The first, second and third power signal lines are a neutral line, a fire line and a ground line, respectively. The first conducting wire and the second conducting wire are covered with high voltage resistant insulating material.

In an embodiment, the first conducting wire and the second conducting wire which are covered with high voltage resistant insulating material are enamel-insulated wires or wire fuses.

Preferably, the enamel-insulated wire has a diameter ranged from 0.2 to 0.3 mm to withstand a current of 50~150 amperes.

In accordance with a second aspect of the present invention, there is provided an electrical socket. The electrical socket comprises first and second power signal lines, first surge absorber and a first conducting wire. The first and second power signal lines are electrically connected to a signal processing device. The first surge absorber has an end electrically connected to the first power signal line. The first conducting wire is covered with insulating material and electrically connected to the other end of the first surge absorber and the second power signal line. The first surge absorber absorbs energy of a surge signal in a short-circuit state when the surge signal flows through the first power signal line or the second power signal line. Afterwards, the first conducting wire which is connected to the first surge absorber in series is damaged by the energy of the surge signal to enter an interrupted state, thereby protecting a signal processing device which is electrically connected to the first power signal line and the second power signal line.

In accordance with a third aspect of the present invention, there is provided an electrical socket. The electrical socket comprises a circuitry substrate, a first surge absorber and a first conducting wire. The circuitry substrate has thereon first and second power signal lines electrically connected to a signal processing device. The first surge absorber has an end to be electrically connected to the first power signal line via an external wiring manner. The first conducting wire is covered with insulating material and electrically connected to the other end of the first surge absorber and the second power signal line via an external wiring manner, so that the first surge absorber and the first conducting wire are electrically connected to the circuitry substrate in series. The first surge absorber absorbs energy of a surge signal in a short-circuit state when the surge signal flows through the first power signal line or the second power signal line. Afterwards, the first conducting wire which is connected to the first surge absorber in series is damaged by the energy of the surge signal to enter an interrupted state, thereby protecting a signal processing device which is electrically connected to the first power signal line and the second power signal line.

In an embodiment, the external wiring manner is performed via a welding technology.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
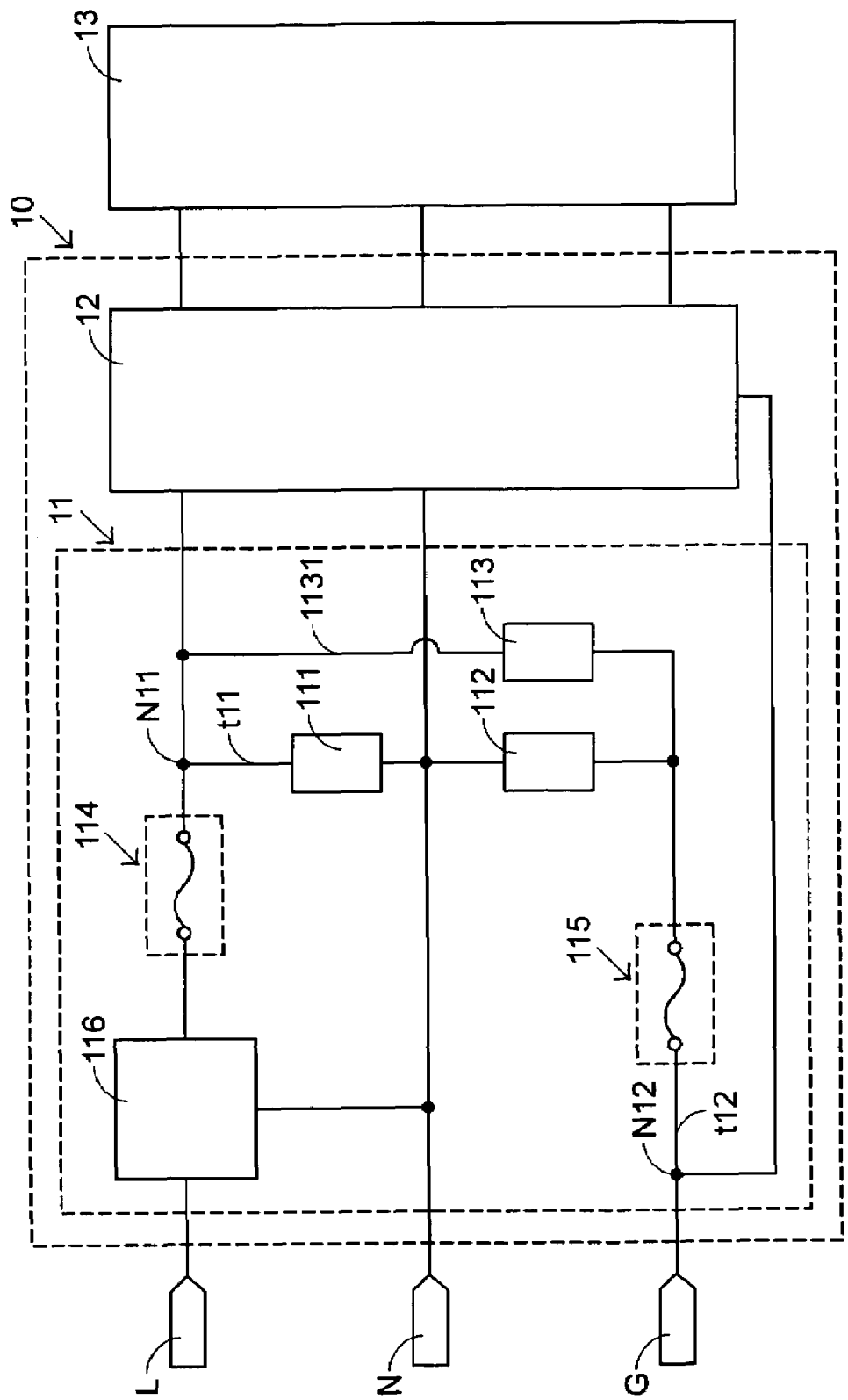
FIG. 1 is a schematic circuit diagram of a conventional electrical socket.
Figure 2:
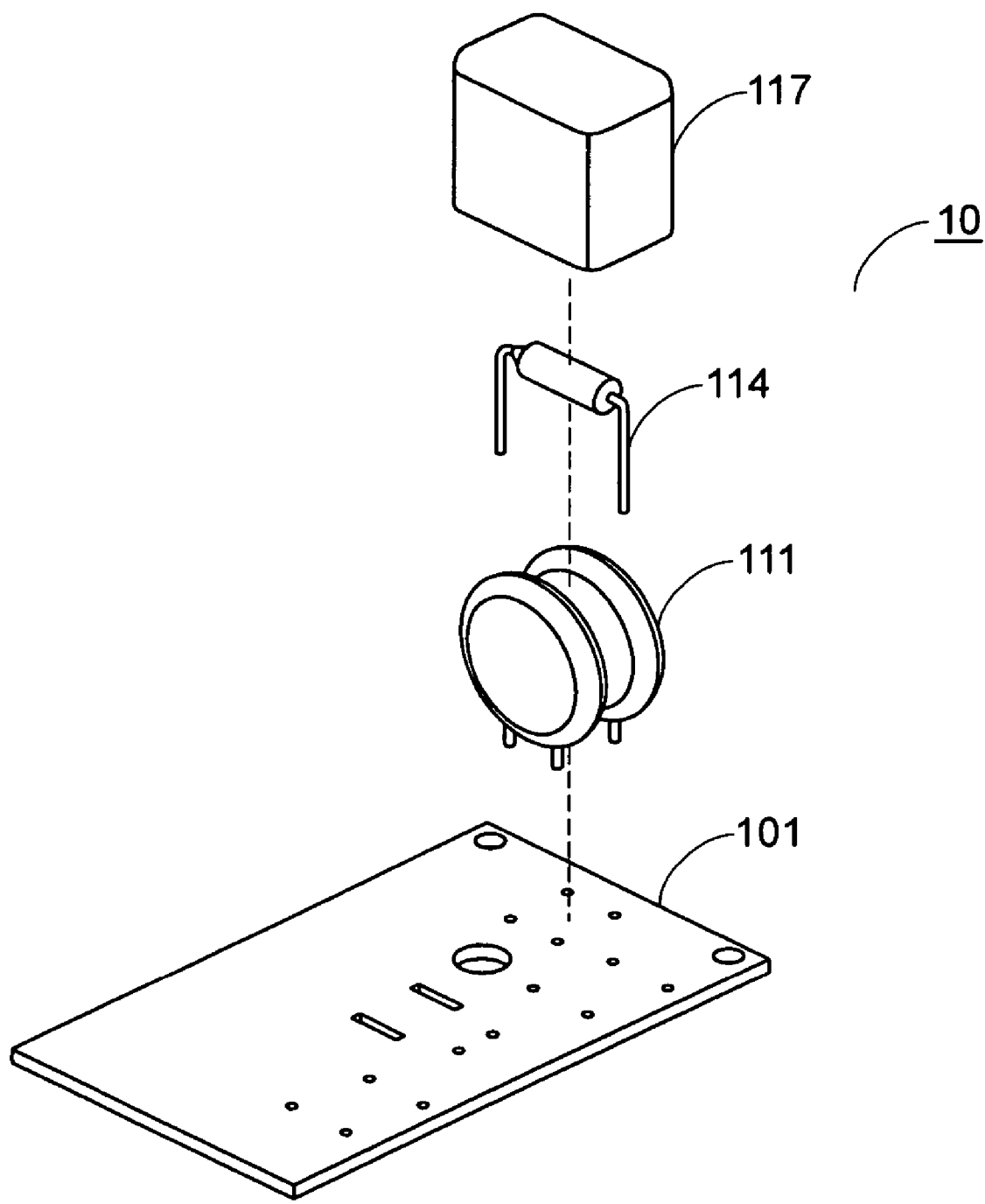
FIG. 2 is a schematic layout structure illustrating a surge absorber and an isolating casing of the conventional electrical socket shown in FIG. 1.
Figure 3:
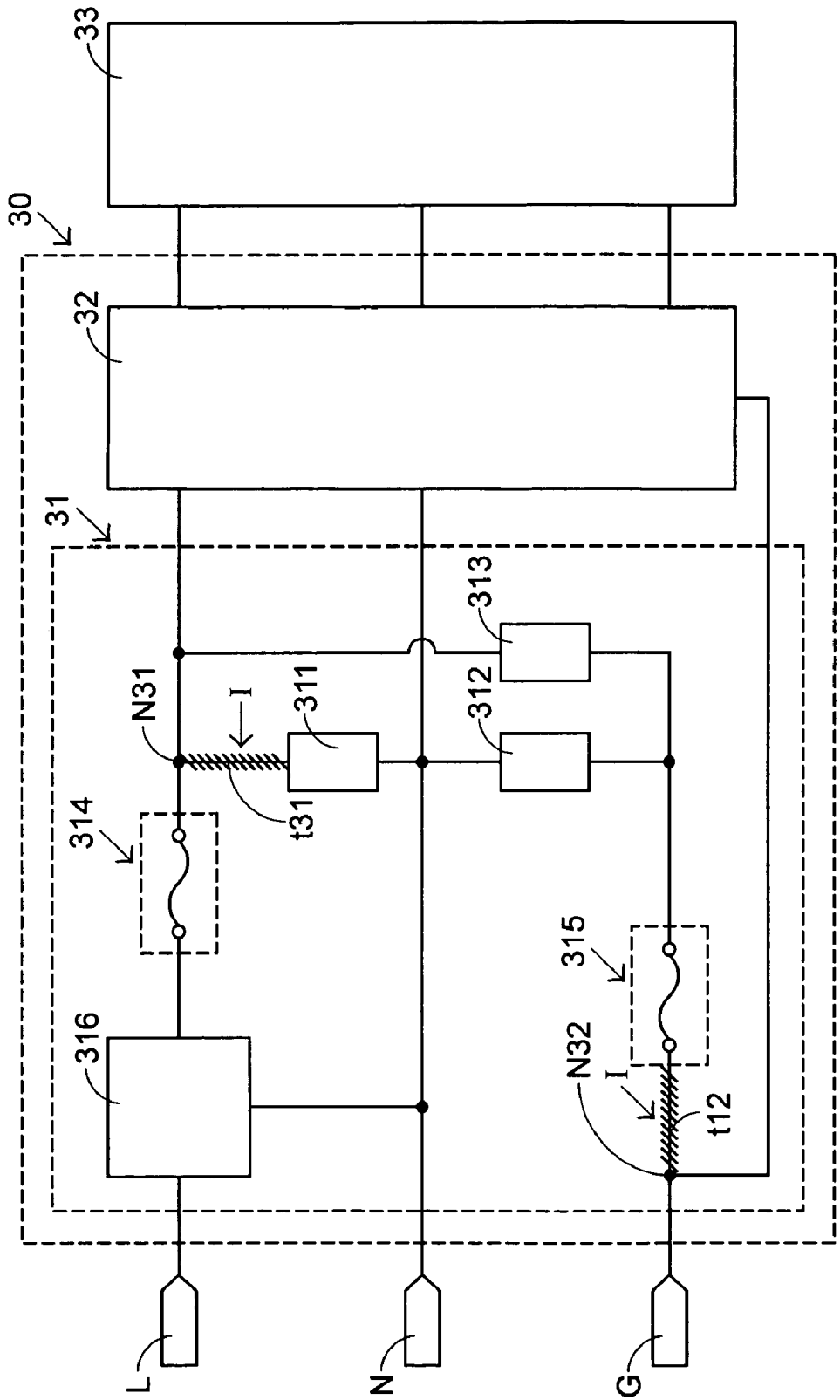
FIG. 3 is a schematic circuit diagram of another conventional electrical socket.
Figure 4:
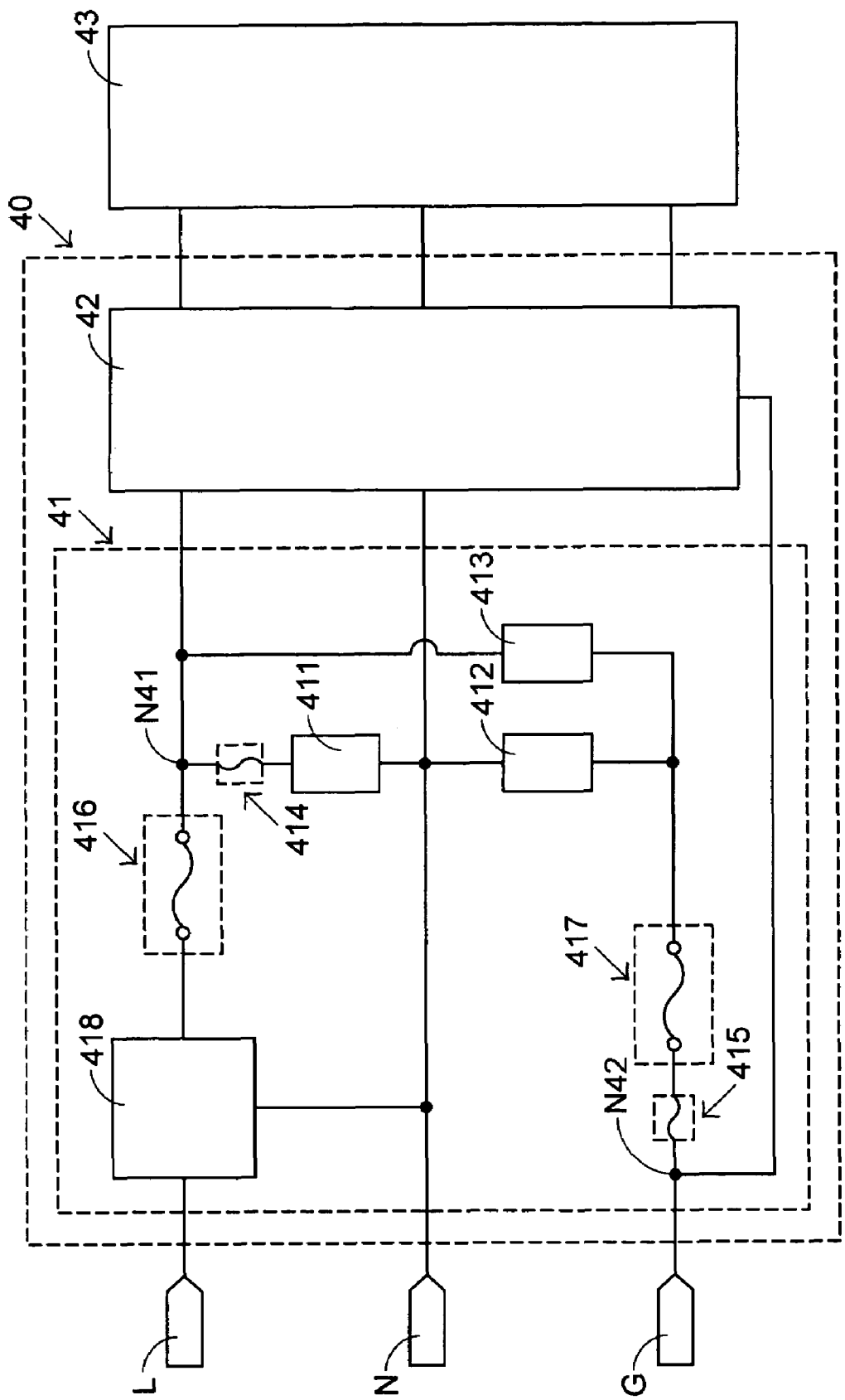
FIG. 4 is a schematic circuit diagram of an electrical socket according to a preferred embodiment of the present invention.

Referring to FIG. 4, a schematic circuit diagram of an electrical socket according to a preferred embodiment of the present invention is illustrated. The electrical socket 40 of FIG. 4 comprises a surge protection circuit 41 and a power supply circuit 42. The power supply circuit 42 of the electrical socket 40 has a socket structure (not shown) to be electrically connected with a signal processing device 43. Via the electrical socket 40, the electrical signals from the first power signal line N, the second power signal line L and the third power signal line G are transmitted to the signal processing device 43. The first, second and third surge absorbers 411, 412, 413, the first and second thermal fuses 416, 417, the break-switch 418 and the circuitry substrate (not shown) for supporting the electrical socket 40 are similar to those shown in FIGS. 1 and 3, and are not intended to redundantly describe herein. It is noted that, however, those skilled in the art will readily observe that numerous modifications and alterations of the first and second thermal fuses 416, 417 may be made while retaining the teachings of the invention. Accordingly, the above disclosure should be limited only by the bounds of the following claims.

Each of the surge absorbers 411, 412 and 413 is implemented by one, two or three metal oxide varistors (MOVs). It is preferred that any two metal oxide varistors (MOVs) are served as a surge absorber.

In this embodiment, the first, second and third power signals are the neutral line N, the fire line L and the ground line G, respectively. Alternatively, only any two power signals, e.g. the fire line L and the ground line G, are selected to suppress the surge signals.

In comparison with the conventional surge protection circuit, the first conducting wire 414 and the second conducting wire 415 are covered with insulating material. The first conducting wire 414 is arranged between the first surge absorber 411 and the node N41. The second conducting wire 415 is arranged the node N42 and the second thermal fuse 417. The first conducting wire 414 has an end electrically connected to the first surge absorber 411 and the other end electrically connected to the second power signal line L via welding technologies. Likewise, the second conducting wire 415 has an end electrically connected to the second thermal fuse 417 and the other end electrically connected to the third power signal line G. By means of such arrangement, when the surge signals flow through the first power signal line N or the second power signal line L, the first surge absorber 411 will absorb energy of the surge signals in a short-circuit state. Afterwards, the first conducting wire 414 which is connected to the first surge absorber 411 in series is damaged by the energy of the surge signals, thereby entering an interrupted state. Since the first conducting wire 414 is externally wired to the circuitry substrate of the electrical socket 40, the first surge absorber 411 is capable of protecting the signal processing device 43, which is electrically connected to first power signal line N and the second power signal line L. Moreover, even if the first conducting wire 414 is carbonized, the electronic components or traces on the circuitry substrate will not be affected, so that no leakage current path is generated and the fabricating cost is reduced.

Likewise, if the surge signals are transmitted between the first power signal line N and the third power signal line G to the signal processing device 43, or transmitted between the second power signal line L and the third power signal line G to the signal processing device 43, the second surge absorber 412, the third surge absorber 413 and the external second conducting wire 415 are cooperated to eliminate the surge signals and avoid generation of leakage current path from carbonization.

In this embodiment, the first conducting wire 414 and the second conducting wire 415 are covered with high voltage resistant insulating material. In order to avoid generation of leakage current path from carbonization, the first conducting wire 414 or the second conducting wire 415 is implemented by a wire fuse. For a purpose of further withstanding high current of 50~150 amperes or overcurrent greater than 1,000 amperes and withstanding transient voltage surge of 6 KV/500 A or 6 KV/3 KA according to the safety regulations TVSS, the first conducting wire 414 or the second conducting wire 415 is an enamel-insulated wire having the diameter ranged from 0.2 to 0.3 mm.

In a case that an exceptional current of 50~150 amperes flows though the first conducting wire 414 or the second conducting wire 415, the first conducting wire 414 or the second conducting wire 415 is kept in a conductive state in a very short time interval, e.g. 0.5 second. Meanwhile, the surge absorbers connected to the first conducting wire 414 or the second conducting wire 415 can absorb sufficient energy of the surge signals. Moreover, once the time interval has passed, the first conducting wire 414 or the second conducting wire 415 immediately enters the interrupted state. Under this circumstance, the energy absorbed by the surge absorber is not too much to cause ignition.

From the above description, the surge protection circuit of the present invention is capable of avoiding generation of leakage current path from carbonization and withstanding transient voltage surge of 6 KV/3 KA according to the new standard for Safety for Transient Voltage Surge Suppression (TVSS) without largely increasing the fabricating cost.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A surge protection circuit comprising:
   a first surge absorber having an end electrically connected to a first power signal line; and
   a first external conducting wire covered with high voltage resistant insulating material and electrically connected to the other end of said first surge absorber and a second power signal line,
   wherein said first surge absorber absorbs energy of a surge signal in a short-circuit state when said surge signal flows through said first power signal line or said second power signal line, and afterwards said first external conducting wire which is connected to said first surge absorber in series is damaged by the energy of said surge signal to enter an interrupted state, thereby protecting a signal processing device which is electrically connected to said first power signal line and said second power signal line.

2. The surge protection circuit according to claim 1 further comprising a second surge absorber having an end electrically connected to said first power signal line and the other end electrically connected to a second external conducting wire which is electrically connected to a third power signal line and covered with high voltage resistant insulating material, thereby protecting said signal processing device which is electrically connected to said first power signal line and said third power signal line.

3. The surge protection circuit according to claim 1 further comprising a third surge absorber having an end electrically connected to said second power signal line and the other end electrically connected to said second external conducting wire which is electrically connected to a third power signal line and covered with high voltage resistant insulating material, thereby protecting said signal processing device which is electrically connected to said second power signal line and said third power signal line.

4. The surge protection circuit according to claim 3 further comprising a first thermal fuse having an end electrically connected to said second power signal and the other end electrically connected to said third surge absorber and said first external conducting wire, such that said first thermal fuse is arranged between said second power signal and said third surge absorber/said first external conducting wire and in the vicinity of said first surge absorber.

5. The surge protection circuit according to claim 3 further comprising a second thermal fuse having an end electrically connected to said second external conducting wire and the other end electrically connected to said second surge absorber and said third surge absorber, such that said second thermal fuse is arranged between said second external conducting wire and said second surge absorber/said third surge absorber and in the vicinity of said second surge absorber and said third surge absorber.

6. The surge protection circuit according to claim 3 wherein each of said first, second and third surge absorbers is a metal oxide varistor (MOV), said first, second and third power signal lines are a neutral line, a fire line and a ground line, respectively.

7. The surge protection circuit according to claim 6 wherein said first external conducting wire and said second external conducting wire which are covered with high voltage resistant insulating material are enamel-insulated wires.

8. The surge protection circuit according to claim 7 wherein said enamel-insulated wire has a diameter ranged from 0.2 to 0.3 mm to withstand a current of 50~150 amperes.

9. An electrical socket comprising:
   first and second power signal lines electrically connected to a signal processing device;
   a first surge absorber having an end electrically connected to said first power signal line; and
   a first external conducting wire covered with high voltage resistant insulating material and electrically connected to the other end of said first surge absorber and said second power signal line,
   wherein said first surge absorber absorbs energy of a surge signal in a short-circuit state when said surge signal flows through said first power signal line or said second power signal line, and afterwards said first external conducting wire which is connected to said first surge absorber in series is damaged by the energy of said surge signal to enter an interrupted state, thereby protecting a signal processing device which is electrically connected to said first power signal line and said second power signal line.

10. The electrical socket according to claim 9 further comprising a first thermal fuse having an end electrically connected to said second power signal and the other end electrically connected to said first external conducting wire, such that said first thermal fuse is arranged between said second power signal and said first external conducting wire and in the vicinity of said first surge absorber.

11. The electrical socket according to claim 9 further comprising:
   a second surge absorber having an end electrically connected to said first power signal line;
   a third surge absorber having an end electrically connected to said second power signal line; and
   a second external conducting wire covered with high voltage resistant insulating material, and having a terminal electrically connected to the other ends of said second and third surge absorber and the other terminal electrically connected to a third power signal line, thereby protecting said signal processing device which is electrically connected to said first, second and third power signal lines.

12. The electrical socket according to claim 11 further comprising a second thermal fuse having an end electrically connected to said second external conducting wire and the other end electrically connected to said second surge absorber and said third surge absorber, such that said second thermal fuse is arranged between said second external conducting wire and said second surge absorber/said third surge absorber and in the vicinity of said second surge absorber and said third surge absorber.

13. The electrical socket according to claim 11 wherein each of said first, second and third surge absorbers is a metal oxide varistor (MOV), said first, second and third power signal lines are a neutral line, a fire line and a ground line, respectively.

14. The electrical socket according to claim 13 wherein said first external conducting wire and said second external conducting wire which are covered with high voltage resistant insulating material are enamel-insulated wires.

15. The electrical socket according to claim 14 wherein said enamel-insulated wire has a diameter ranged from 0.2 to 0.3 mm to withstand a current of 50~150 amperes.

16. An electrical socket comprising:
   a circuitry substrate having thereon first and second power signal lines electrically connected to a signal processing device;

a first surge absorber having an end to be electrically connected to said first power signal line via an external wiring manner; and a first external conducting wire covered with high voltage resistant insulating material and electrically connected to the other end of said first surge absorber and said second power signal line via an external wiring manner so that said first surge absorber and said first external conducting wire are electrically connected to said circuitry substrate in series, wherein said first surge absorber absorbs energy of a surge signal in a short-circuit state when said surge signal flows through said first power signal line or said second power signal line, and afterwards said first external conducting wire which is connected to said first surge absorber in series is damaged by the energy of said surge signal to enter an interrupted state, thereby protecting a signal processing device which is electrically connected to said first power signal line and said second power signal line.

17. The electrical socket according to claim 16 further comprising:

a second surge absorber having an end electrically connected to said first power signal line via an external wiring manner;

a third surge absorber having an end electrically connected to said second power signal line via an external wiring manner; and a second external conducting wire covered with high voltage resistant insulating material, and having a terminal electrically connected to the other ends of said second and third surge absorber and the other terminal electrically connected to a third power signal line via an external wiring manner, thereby protecting said signal processing device which is electrically connected to said first, second and third power signal lines.

18. The electrical socket according to claim 17 further comprising:

a first thermal fuse having an end electrically connected to said second power signal and the other end electrically connected to said first external conducting wire, such that said first thermal fuse is arranged between said second power signal and said first external conducting wire and in the vicinity of said first surge absorber; and a second thermal fuse having an end electrically connected to said second external conducting wire and the other end electrically connected to said second surge absorber and said third surge absorber, such that said second thermal fuse is arranged between said second external conducting wire and said second surge absorber/said third surge absorber and in the vicinity of said second surge absorber and said third surge absorber.

19. The electrical socket according to claim 17 wherein each of said first, second and third surge absorbers is a metal oxide varistor (MOV), said first, second and third power signal lines are a neutral line, a fire line and a ground line, respectively.

20. The electrical socket according to claim 16 wherein said external wiring manner is performed via a welding technology.

* * * * *